(12) United States Patent
Johnson

(10) Patent No.: US 6,628,390 B1
(45) Date of Patent: Sep. 30, 2003

(54) WAFER ALIGNMENT SENSOR USING A PHASE-SHIFTED MICROLENS ARRAY

(76) Inventor: Kenneth C. Johnson, 2502 Robertson Rd., Santa Clara, CA (US) 95051

(*) Notice: Subject to any disclaimer, the term of this patent is extended or adjusted under 35 U.S.C. 154(b) by 474 days.

(21) Appl. No.: 09/664,997

(22) Filed: Sep. 18, 2000

Related U.S. Application Data

(60) Provisional application No. 60/177,994, filed on Jan. 24, 2000.

(51) Int. Cl.[7] .......................... G01B 11/00; G01B 11/14; G01B 11/02; G01B 9/02
(52) U.S. Cl. ...................... 356/400; 356/401; 356/485; 356/490; 356/622; 356/624; 356/509
(58) Field of Search ................... 356/399–401, 356/614, 622, 624, 485–486, 490, 508–509

(56) References Cited

U.S. PATENT DOCUMENTS

| | | | | |
|---|---|---|---|---|
| 5,239,178 A | * | 8/1993 | Derndinger et al. | 250/234 |
| 6,133,986 A | * | 10/2000 | Johnson | 355/67 |
| 6,177,980 B1 | * | 1/2001 | Johnson | 355/67 |
| 6,392,752 B1 | * | 5/2002 | Johnson | 356/511 |
| 6,424,404 B1 | * | 7/2002 | Johnson | 355/44 |
| 6,489,984 B1 | * | 12/2002 | Johnson | 347/239 |

FOREIGN PATENT DOCUMENTS

| | | | |
|---|---|---|---|
| WO | WO 97/34171 | 9/1897 | G02B/21/06 |

OTHER PUBLICATIONS

Tiziani, Hans J. et al., "Three–dimensional analysis by a microlens–array confocal arrangement," *Applied Optics*, vol. 33(4), Feb. 1, 1994; pp. 567–572.
Tiziani, H.J. et al., "Theoretical analysis of confocal microscopy with microlenses," Applied Optics, vol. 35(1), Jan. 1, 1996, pp. 120–125.

* cited by examiner

*Primary Examiner*—Russell Adams
*Assistant Examiner*—Magda Cruz
(74) *Attorney, Agent, or Firm*—Townsend and Townsend and Crew LLP

(57) ABSTRACT

A wafer alignment sensor uses a microlens array for sensing the position of an alignment pattern on a semiconductor wafer. Phase interactions between adjacent microlenses are suppressed—or alternatively, enhanced—by inducing a $\pi/2$ optical phase shift on alternate microlenses and by optimizing the optical transmittance profile of the alignment system's projection aperture.

32 Claims, 10 Drawing Sheets

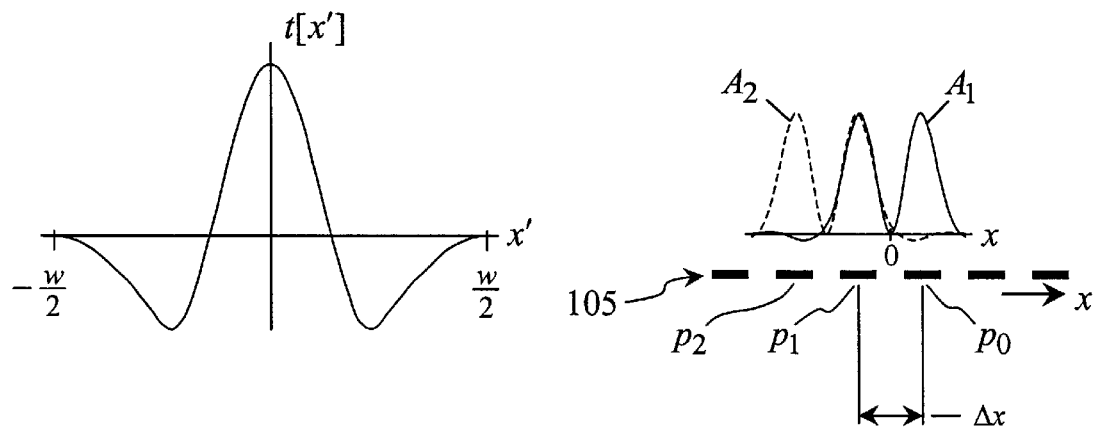
Fig 12    Fig 13
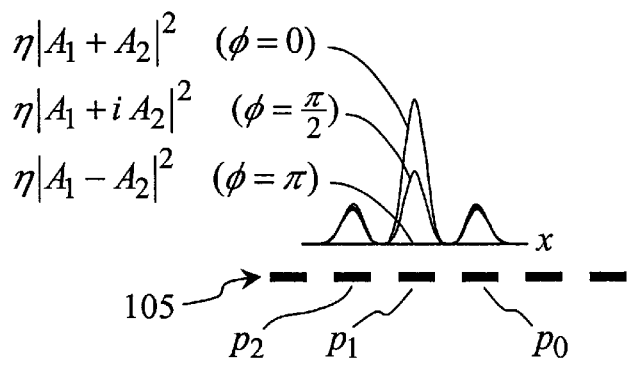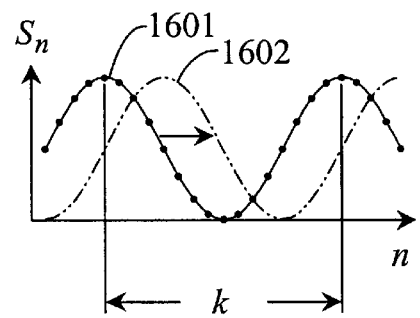
Fig 14    Fig 16

WAFER ALIGNMENT SENSOR USING A PHASE-SHIFTED MICROLENS ARRAY

CROSS-REFERENCES TO RELATED APPLICATIONS

This application claims priority from the following provisional patent application, the disclosure of which is incorporated by reference:

"Wafer Alignment Sensor Using a Phase-Shifted Microlens Array," Provisional Application No. 60/177,994, filed Jan. 24, 2000.

The following patent applications are hereby incorporated by reference in their entirety for all purposes:

"Microlens Scanner for Microlithography and Wide-Field Confocal Microscopy" (U.S. patent application Ser. No. 08/803,096, filed Feb. 20, 1997);

"Pixel Cross Talk Suppression in Digital Microprinters" (U.S. patent application Ser. No. 09/473,081, filed Dec. 28, 1999); and "Multi-Stage Microlens Array" (U.S. patent application Ser. No. 09/481,379, filed Jan. 11, 2000).

BACKGROUND OF THE INVENTION

This invention relates generally to micro-imaging and position sensing applications employing microlens arrays.

Scanning microlens arrays are useful for imaging and position-sensing applications such as wafer alignment tracking in maskless lithography systems. In a typical application such as a microlens lithography system (U.S. patent application Ser. No. 08/803,096), an object surface such as an alignment tracking pattern on a semiconductor wafer is illuminated in reflection mode through a proximate microlens array, and each microlens concentrates illumination onto a corresponding focus spot on the object surface. The reflected illumination transmits back through the microlenses and is projected onto a detector pixel array, and each pixel senses light from a particular corresponding microlens and focus spot. The detector signal is acquired as the surface is scanned across the focus spot array, and the signal data is analyzed to determine positional information and provide feedback to a position actuator mechanism (positioning servo).

The scanning microlens system makes it possible to acquire very high-resolution image data using comparatively low-resolution projection optics. But due to the projection optics' low resolution, the detector-plane image field originating from a typical focus spot can have diffraction tails extending across multiple pixels, resulting in degraded image contrast and resolution. It is thus desirable to suppress or mitigate the effect of such diffraction tails.

One method that is commonly used to suppress diffraction tails is aperture apodization. An application of apodization in the context of microscopy is described in U.S. Pat. No. 5,859,424. Although this patent does not relate to microlens imaging systems, the disclosed apodization method and apodizer construction can be applied in an obvious manner to microlens microscopy and position sensing. A similar apodization method is discussed in U.S. patent application Ser. No. 08/803,096 in the context of microlens printing and lithography systems, and this method is equally applicable to microscopy and sensing. Although apodization can reduce the magnitude of the diffraction tails, it does not eliminate them entirely, and further mitigation of diffraction effects would be beneficial.

The effect of diffraction tails in microlens microscopy is strongly affected by the phase relationship between overlapping detector-plane image fields originating from different focal points. The effect is strongest when the fields are coherently superimposed and in phase. A similar situation can occur with microlens printing (U.S. patent application Ser. No. 08/803,096), wherein an exposure illumination field on a printing surface comprises a coherent, overlapping superposition of component fields originating from different source pixels in a spatial light modulator. Co-pending U.S. patent application Ser. No. 09/473,081 describes a method whereby the image source (i.e., the spatial light modulator) can be constructed to optimize the exposure field's phase relationships and thereby mitigate the effect of diffraction tails. However, this method does not apply in an obvious manner to microlens microscopy and position sensing, because in this case the image source is an inspection sample or tracking pattern whose reflectance phase characteristics generally cannot be predetermined by design.

Although phase coherence effects are usually detrimental to microscopic imaging, some imaging techniques such as differential interference contrast microscopy exploit such effects to enhance imaging and position sensing capability. But such methods have not been applied with microlens imaging systems.

SUMMARY OF THE INVENTION

As indicated above, diffraction effects in microlens microscopy apparatus are strongly affected by the phase relationships between image fields originating from different focal points. The invention provides techniques for configuring the optical subsystem to mitigate, or exploit, the phase relationships. In this context, the optical subsystem refers to the microlens array, detector pixel array, and projection system.

Coherent phase interactions between the fields can be suppressed by inducing an optical phase shift in alternate microlenses so that the detector-plane optical fields originating from adjacent microlens focus spots have an induced relative phase shift of approximately $\pi/2$. (The phase shift can be induced, for example, by using a phase plate or by appropriate selection of the microlens thicknesses.) This design modification alone can significantly reduce coherence effects in the detector-acquired image if the object surface is flat and has a uniform reflectance phase distribution. Under more general conditions the same result can be achieved by superimposing two images that are acquired with the surface positionally shifted by one microlens unit between image acquisitions. The positional shift sign-inverts the image's phase interaction component so that it cancels out in the superimposed image. (A microlens imaging system typically operates in a scanning mode, and the two images could be acquired by simply extending the scan range so that each object point is scanned by at least two adjacent microlenses.)

In the above-outlined embodiment of the invention, the phase-shifted microlens array preferably operates in conjunction with an apodization filter in the system projection aperture, which functions to minimize the magnitude of the diffraction tails and preferentially control their spatial distribution.

In an alternative embodiment, the apodization filter is replaced by a beam-splitting filter, which splits the energy from each microlens into two dominant diffraction lobes that illuminate two adjacent detector pixels. In this embodiment, each detector pixel senses coherently-superimposed radiation from two adjacent microlenses; and the invention functions to enhance, rather than suppress, the phase interactions. This embodiment provides phase contrast imaging capability for wafer alignment tracking.

A further understanding of the nature and advantages of the present invention may be realized by reference to the remaining portions of the specification and the drawings.

BRIEF DESCRIPTION OF THE DRAWINGS

FIG. 12 illustrates a beam-splitting filter's amplitude transmittance (or reflectance) function;

FIG. 13 illustrates the detector-plane field amplitude generated with a beam-splitting transmission filter in the projection aperture;

FIG. 14 illustrates the detector-plane irradiance profile for several reflectance phase values;

FIG. 16 illustrates a Moire signal pattern obtained with the alignment tracking system of FIG. 15.

DESCRIPTION OF THE SPECIFIC EMBODIMENTS

Diffraction Mitigation

Figure 1:
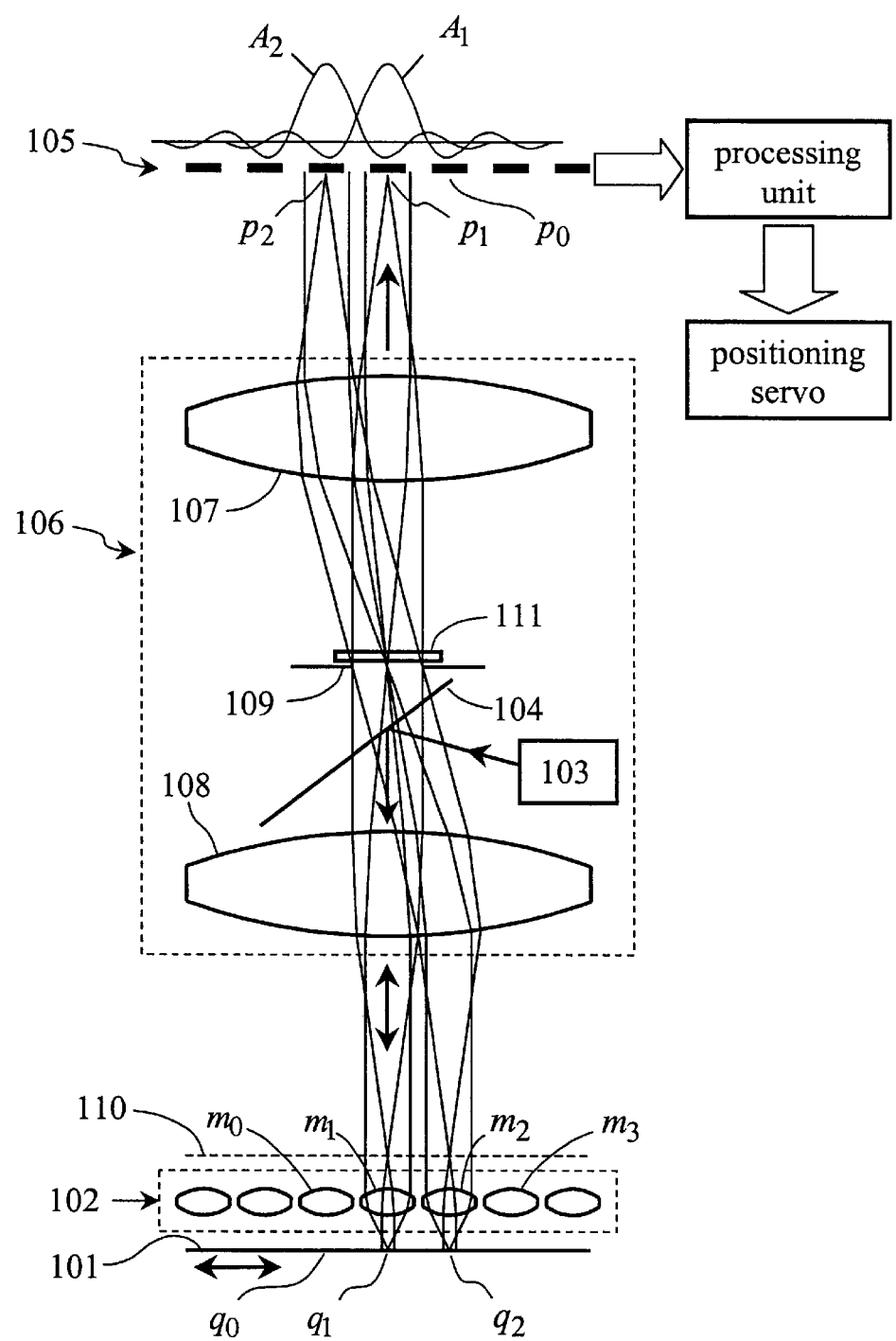
FIG. 1 is a cross-sectional schematic view of a microlens imaging system comprising a phase-shifted microlens array.

FIG. 1 schematically illustrates a preferred embodiment of the invention that would be useful for mitigating the effects of aperture diffraction in a microlens imaging system. This embodiment has many elements and functions in common with prior art systems (as described in U.S. patent application Ser. No. 08/803,096). These aspects of the invention will first be outlined, and then the novel elements will be described.

An object surface 101 such as an alignment pattern on a semiconductor wafer is illuminated in reflection mode through a microlens array 102 comprising microlenses $m_0$, $m_1$, $m_2$, etc. Illumination from an illumination source 103 is directed toward the array by means of a beam splitter 104, and is concentrated by the microlenses onto an array of focus spots on the object surface. For example, microlenses $m_1$ and $m_2$ concentrate illumination onto respective focus spots $q_1$ and $q_2$. The illumination reflects or scatters off the surface, is recollected by the microlenses, and is projected onto a detector array 105 by means of an optical projection system 106.

In FIG. 1 the projection optics are illustrated schematically as a pair of lenses 107 and 108 and an aperture stop 109 (the "projection aperture"), but alternative projection optics such as catadioptric systems may also be employed. (A projection system using all-reflective optics is described herein under the section heading, "Alternative Projection Optics.") Detector array 105 is conjugate to plane 110, which preferably coincides with the microlenses' back focal plane. In practice, however, the projection system may have sufficient depth of focus that the microlenses could simply be imaged directly onto corresponding detector elements; i.e., the detector conjugate plane 110 could be located at the microlens array 102. The detector pixel signals are collected and processed by a processing unit, which calculates positional information and conveys the information to a positioning servo control system that controls the wafer position. The microlens array, the detector pixel array, and the projection system can be considered to define an optical subsystem.

The detector array comprises detector pixel elements $p_0$, $p_1$, $p_2$, etc. that receive illumination from respective corresponding microlenses $m_0$, $m_1$, $m_2$, etc.; thus each pixel senses the object surface reflectivity at the corresponding microlens's focus spot. Due to aperture diffraction at aperture stop 109 the image field originating from a typical microlens may overlap several pixels, which could result in degraded image contrast and resolution. However, the present invention mitigates such diffraction effects.

Microlens array 102 is configured in the FIG. 1 embodiment to impose a phase shift on the transmitted optical radiation in order to minimize coherent interactions between overlapping image fields. (The schematic view of FIG. 1 does not show the specific mechanism that imparts the phase shift, but several possible phase-shifting mechanisms will be described below.) This embodiment of the invention also preferably comprises an apodizing transmission filter 111 in or proximate to aperture 109, wherein the filter functions to reduce the magnitude of the diffraction tails. Furthermore, aperture 109 and filter 111 (if present) are preferably configured to control the diffraction tails' spatial distribution in order to optimize the phase-shifting action of the phase-shifted microlens array 102.

The operation of the phase-shifted microlens array can be illustrated by considering its action on the detector-plane image fields originating from two adjacent microlenses such as lenses $m_1$ and $m_2$ in FIG. 1. The respective detector-plane field amplitudes originating from these two points, without the induced phase shift, will be denoted as $A_1$ and $A_2$ in the following discussion. These field distributions are illustrated schematically in FIG. 1. The $A_1$ and $A_2$ field distributions are primarily concentrated onto respective pixels $p_1$ and $p_2$, but each distribution has diffraction tails extending across adjacent pixels. (In FIG. 1 $A_1$ and $A_2$ are illustrated as real-valued quantities, although in general the field amplitudes may be complex-valued.)

The irradiance level at any particular point on the detector plane is proportional to the magnitude-squared of the total field amplitude at that point. For example, if object points $q_1$ and $q_2$ in FIG. 1 are the only illuminated points on the object surface that have significant reflectivity, then the detector-plane irradiance E would have the following form without the induced phase shift, $$E = \eta|A_1+A_2|^2 = \eta(|A_1|^2+|A_2|^2+2Re[A_1A_2^*]) \text{ (without the phase shift)} \quad \text{Eq. 1}$$

where $\eta$ is a constant dimensional factor and "Re" denotes the real part of a complex-valued quantity. The right side of this expression includes a coherent phase interaction term $\delta E$, $$\delta E = 2\eta Re[A_1A_2^*] \text{ (without the phase shift)} \quad \text{Eq. 2}$$

which depends on the relative phase of $A_1$ and $A_2$. Eq. 1 assumes that the detector plane is coherently illuminated. If it is incoherently illuminated (for example, if the pixel center spacing is much larger than the coherence length) the interaction term would be absent. For the general case of partially coherent illumination the phase interaction term may be present, but with a diminished amplitude.

Figure 2:
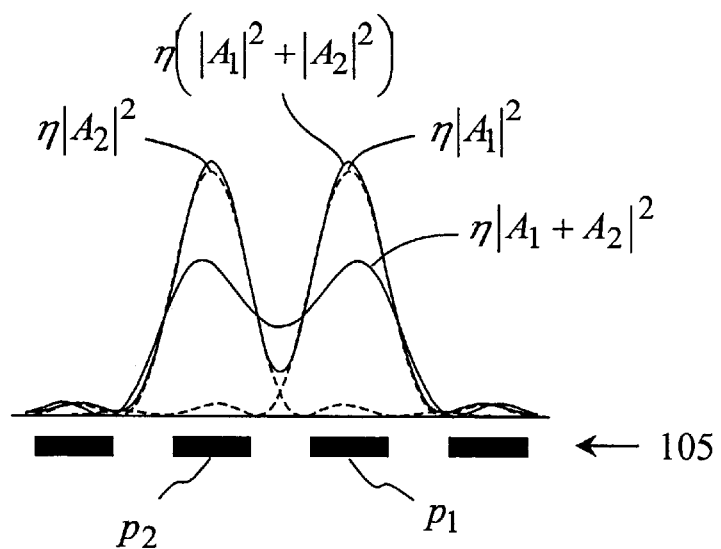
FIG. 2 illustrates the effect of coherent phase interactions on the detector-plane irradiance distribution.

Eqs. 1 and 2 describe how the detector-plane irradiance would be distributed in a prior-art system that does not have the phase-shift mechanism. If the object surface 101 is flat and has uniform reflectance phase, then an optical system such as the projection system 106 illustrated in FIG. 1 (which is telecentric on the object side) will produce image field distributions $A_1$ and $A_2$ that are phase-matched across the detector plane. Under this condition the product term $A_1 A_2^*$ in Eq. 2 will be real-valued, and hence $\delta E$ can have significant magnitude. This situation is illustrated in FIG. 2, which shows the detector-plane irradiance profiles $\eta|A_1|^2$ and $\eta|A_2|^2$ (dashed curves) originating from a single illuminated object point ($q_1$ or $q_2$, respectively), the incoherently-superimposed, two-point irradiance profile $\eta(|A_1|^2+|A_2|^2)$, and the coherently-superimposed profile $\eta|A_1+A_2|^2$ without the phase shift. Over the optically sensitive area of pixel $p_1$, for example, the $A_2$ distribution's diffraction tails do not have much effect on the incoherent irradiance component because this component ($\eta|A_2|^2$) is proportional to the square of $A_2$. However, the coherent interaction component (Eq. 2) is directly proportional to $A_2$ and hence has a much larger effect on the superimposed irradiance profile.

When more than two reflective object surface points are simultaneously illuminated the detector irradiance field will include multiple coherent interaction terms similar to Eq. 2. Each pair of reflecting points will give rise to such a term, but typically the only such terms that are significant are those corresponding to points that are illuminated through adjacent microlenses, such as points $q_1$ and $q_2$ (FIG. 1).

The phase-shifted microlens array mitigates the coherent phase interactions between overlapping image fields such as $A_1$ and $A_2$ by inducing an optical phase shift in alternate microlenses so that the detector-plane optical fields originating from adjacent microlens focus spots have an induced relative phase shift of approximately $\pi/2$. (Particular methods for accomplishing this will be described below.) For example, suppose that the microlens array is configured so that the odd-numbered microlenses $m_1$, $m_3$, etc. (FIG. 1) induce an extra phase shift of or $\pi/2$ in their associated detector-plane field amplitudes relative to the fields associated with the even-numbered microlenses $m_0$, $m_2$, etc. Again using the notation $A_1$ and $A_2$ to denote the detector fields from respective microlenses $m_1$ and $m_2$ without the induced phase shift, the corresponding fields with the phase shift will be i $A_1$ and $A_2$. Hence the coherent interaction term (Eq. 2) will become $$\delta E = 2\eta Re[(iA_1)A_2^*] = -2\eta Im[A_1A_2^*] \text{ (with the phase shift)} \quad \text{Eq. 3}$$

where "Im" denotes the imaginary part of a complex-valued quantity. Under the conditions assumed above (flat object surface 101, uniform reflectance phase), $A_1A_2^*$ is real-valued and the coherent interaction term vanishes ($\delta E=0$).

Figure 3:
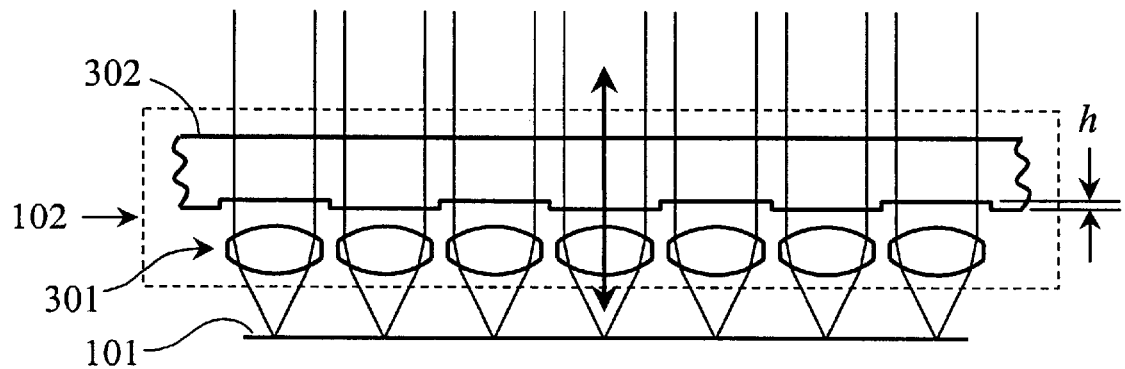
FIG. 3 is a cross-sectional view of a phase-shifted microlens array comprising a phase plate in series with a prior-art microlens array.

The phase shift could be induced by using a phase plate in series with a microlens array, as illustrated in FIG. 3. In this embodiment the phase-shifted microlens array 102 comprises a conventional (prior-art) microlens array 301 in combination with a phase plate 302. The phase plate 302 (shown cross-sectionally) comprises phase-modifying steps of height h over alternate microlenses. Since the radiation passes through the phase plate both before and after reflecting off the object surface 101, the single-pass phase shift should be $\pi/4$ to achieve a if $\pi/2$ double-pass shift. If the illumination wavelength is $\lambda$ and the refractive index change across the phase plate surface is $\Delta n$, the optimal step height is $$h = |\lambda/(8\Delta n)| \quad \text{Eq. 4}$$

(However, if the surface 101 were illuminated in transmission mode the single-pass phase shift would be $\pi/2$ and the step height would be $h=|\lambda/(4\Delta n)|$. Also, if the illumination is not monochromatic the phase shift cannot be optimized for all wavelengths simultaneously, but it can at least be optimized for a specific design wavelength within the illumination's spectral band.)

Figure 4:
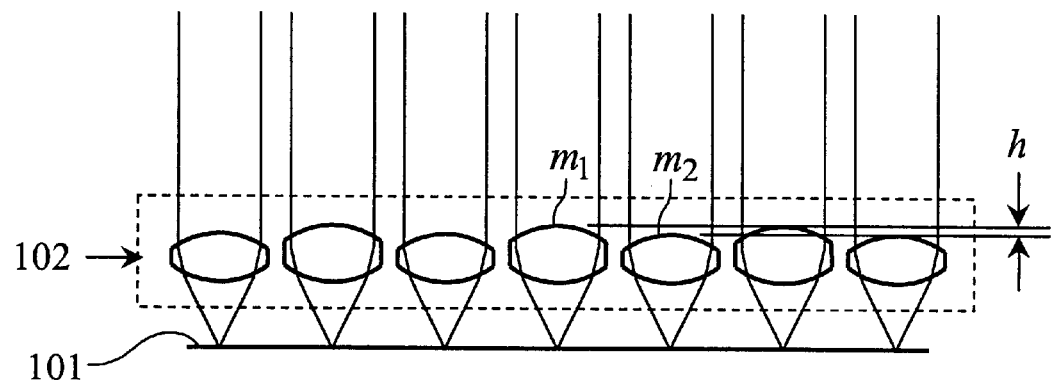
FIG. 4 is a cross-sectional view of a phase-shifted microlens array in which adjacent microlenses have different thicknesses in order to induce a $\pi/2$ relative phase shift between alternate microlenses.

Rather than using a separate phase plate in conjunction with the microlens array, the microlens thicknesses can be selected to induce the desired phase shift. For example, FIG. 4 illustrates a phase-shifted microlens array 102 in which adjacent microlenses such as $m_1$ and $m_2$ have a center thickness difference of h, resulting in a $\pi/2$ phase shift between their corresponding detector fields.

Figure 5:
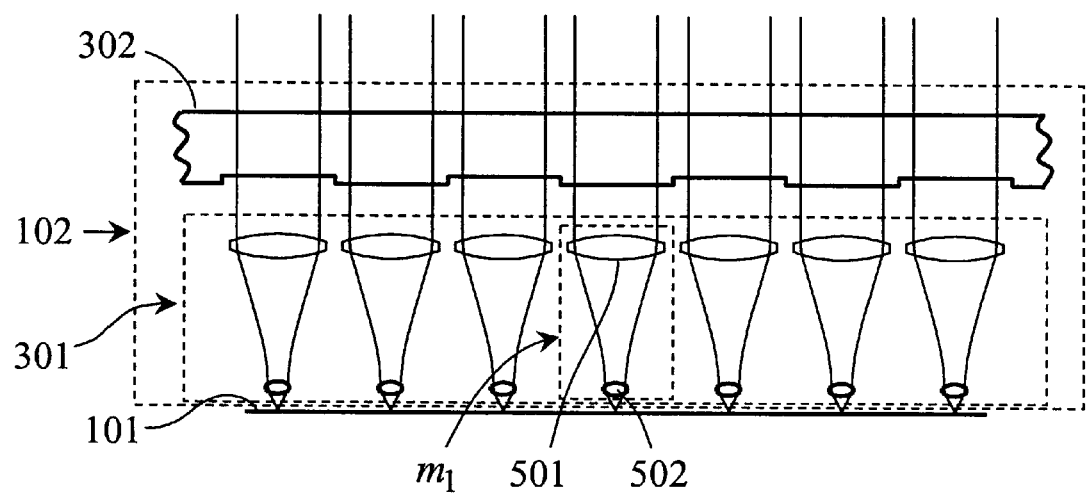
FIG. 5 is a cross-sectional view of a phase-shifted microlens array comprising a phase plate in series with a two-stage microlens array.

The above illustrations use single-element microlenses, but the phase-shift technique is equally applicable to multi-stage microlens arrays comprising compound microlenses. (U.S. patent application Ser. No. 09/481,379 describes multi-stage microlens arrays comprising two or more stages.) For example, FIG. 5 illustrates a variant of the FIG. 3 configuration in which the microlens array 301 is a two-stage array. Each microlens unit in the array is a compound lens comprising first- and second-stage lens elements; for example, microlens $m_1$ comprises lens elements 501 and 502. (In the context of this disclosure the term "microlens" can optionally be construed as a compound lens comprising two or more lens elements, and "microlens array" can be construed as a multi-stage microlens array comprising two or more stages.)

Figure 6A:
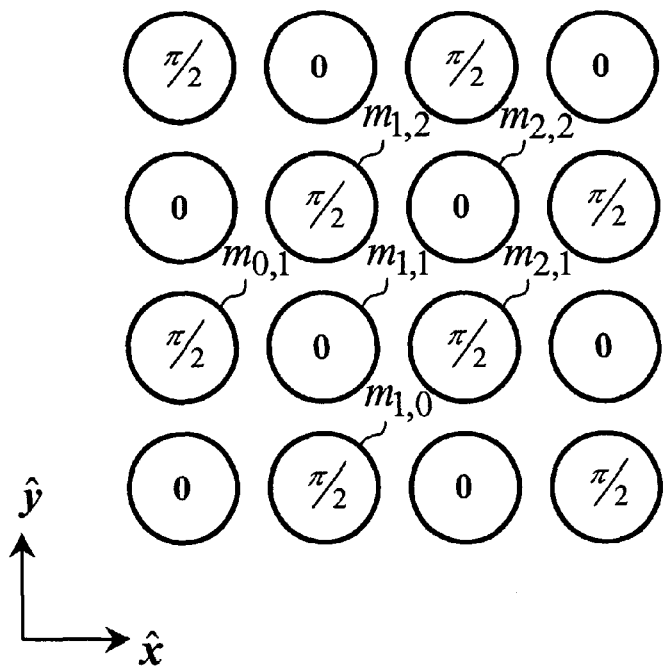
FIGS. 6A and 6B are plan views of two-dimensional, phase-shifted microlens arrays.

FIGS. 1–5 are cross-sectional views showing just a single row of microlenses and corresponding detector pixels, but the phase shift technique is also applicable to two-dimensional arrays. FIG. 6A illustrates a portion of a rectangular array of microlenses (e.g., $m_{1,1}$ and $m_{2,1}$, etc.), with the induced phase shift indicated on each microlens. There is a $\pi/2$ phase shift between each pair of microlenses that are adjacent along either the $\hat{x}$ or $\hat{y}$ directions. The above examples all use bilevel phase distributions, but more than two phase levels could be used. For example, FIG. 6B illustrates an alternative trilevel distribution with phase levels 0, $+\pi/2$, and $-\pi/2$.

Figure 6B:
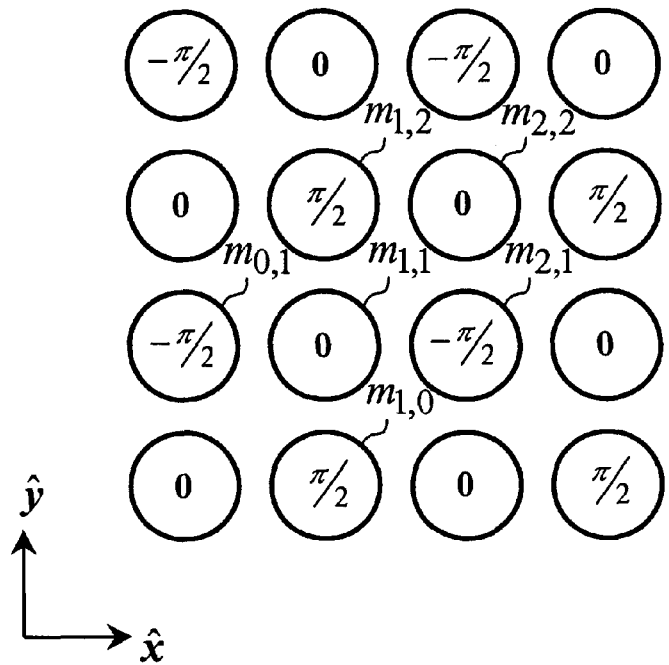
Figure 7:
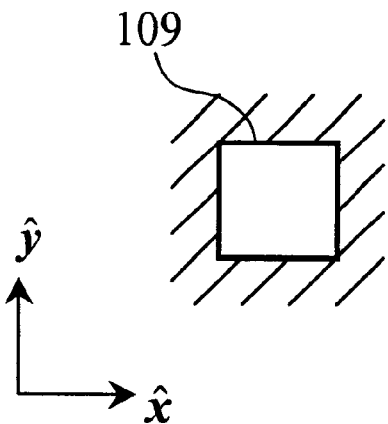
FIG. 7 is a plan view of a rectangular projection aperture.
Figure 8:
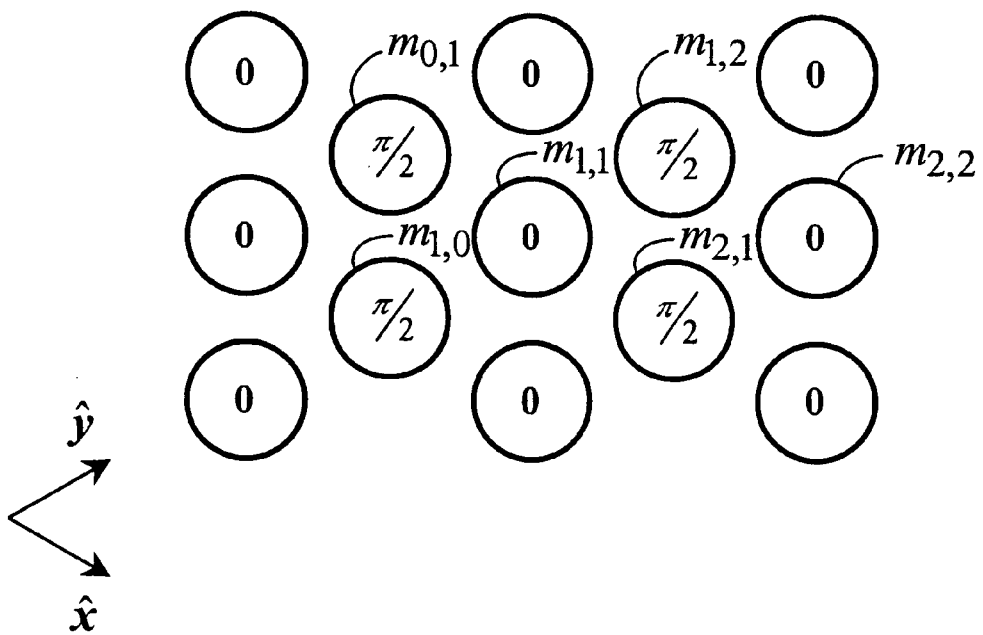
FIG. 8 is a plan view of a two-dimensional, phase-shifted microlens array with a non-rectangular centering pattern.

The phase distributions illustrated in FIGS. 6A and 6B mitigate phase interactions between microlenses that are adjacent along the $\hat{x}$ or $\hat{y}$ directions. For example, microlens $m_{1,1}$ has two adjacent microlenses $m_{1,0}$ and $m_{2,1}$ along the $\hat{x}$ direction, and two adjacent microlenses $m_{1,0}$ and $m_{1,2}$ along the $\hat{y}$ direction, all of which are phase-shifted by $\pm\pi/2$ relative to $m_{1,1}$. The phase shift does not mitigate phase interactions between diagonally adjacent microlenses (such as microlenses $m_{1,1}$ and $m_{2,2}$) but such interactions can be substantially eliminated by using a rectangular projection aperture 109 in the projection system (FIG. 1), with the aperture edges aligned to the $\hat{x}$ and $\hat{y}$ directions as illustrated in FIG. 7. With this type of aperture shape the aperture diffraction is substantially confined to the $\hat{x}$ and $\hat{y}$ directions, so the detector-plane diffraction tails from any particular microlens will be substantially confined to pixels that are adjacent along the $\hat{x}$ or $\hat{y}$ directions. (See Born & Wolf, "Principles of Optics," 7th Ed., 1999; FIG. 8.10 on p. 438.) The phase interactions can be further mitigated by using an apodization filter 111 in the projection aperture 109 (FIG. 1), preferably with an apodization transmittance function that is multiplicatively separable in x and y coordinates corresponding to the $\hat{x}$ and $\hat{y}$ directions. (The separability condition keeps any residual diffraction tails confined primarily to the $\hat{x}$ and $\hat{y}$ directions.) The apodizer could be constructed as a half-tone, binary transmittance mask in the manner described in U.S. Pat. No. 5,859,424.

Figure 9:
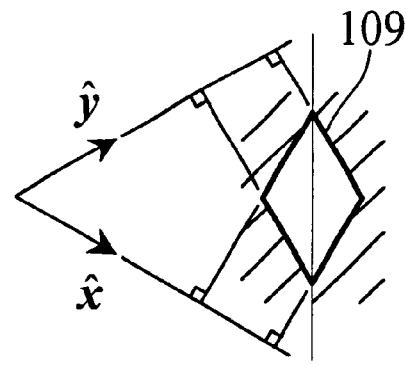
FIG. 9 is a plan view of a parallelogram-shaped projection aperture.

The phase shift technique can also be used with microlens arrays that have a non-rectangular centering pattern, as illustrated in FIG. 8. In this embodiment the array pattern is periodic in each of two non-orthogonal directions indicated as $\hat{x}$ and $\hat{y}$, and microlenses that are adjacent along either of these two directions have an induced relative phase shift of $\pi/2$. The projection aperture 109 has a parallelogram shape with edges perpendicular to the $\hat{x}$ and $\hat{y}$ directions, as illustrated in FIG. 9, so that the aperture-diffracted light is substantially confined to the $\hat{x}$ and $\hat{y}$ directions. (Aperture apodization could also be employed with this type of system, as described above.)

The method for mitigating phase interactions described above is based on the uniform-phase assumption (i.e., the coherent interaction term $\delta E$ in Eq. 3 will only vanish if $A_1 A_2^*$ is real-valued). This condition will not hold if, for example, the object surface's reflectance phase is nonuniform or the surface is not flat. However, the uniform-phase requirement can be eliminated by using an alternative imaging technique in which two detector-acquired images are superimposed, with the object surface positionally shifted by one microlens unit between image acquisitions so that $\delta E$ is sign-inverted. (The positional shift could be effected as part of a continuous image scanning process in which the detector signal is continuously acquired as the surface is scanned.)

The detector-plane irradiance distribution in the first image, denoted $E^{(1)}$, has a form similar to Eq. 1, except that the amplitude field $A_1$ from microlens $m_1$ has an extra factor of $i$ applied, representing a or $\pi/2$ phase shift as described above, $$E^{(1)} = |iA_1 + A_2|^2 = \eta(|A_1|^2 + |A_2|^2 - 2Im[A_1 A_2^*]) \qquad \text{Eq. 5}$$

Figure 10:
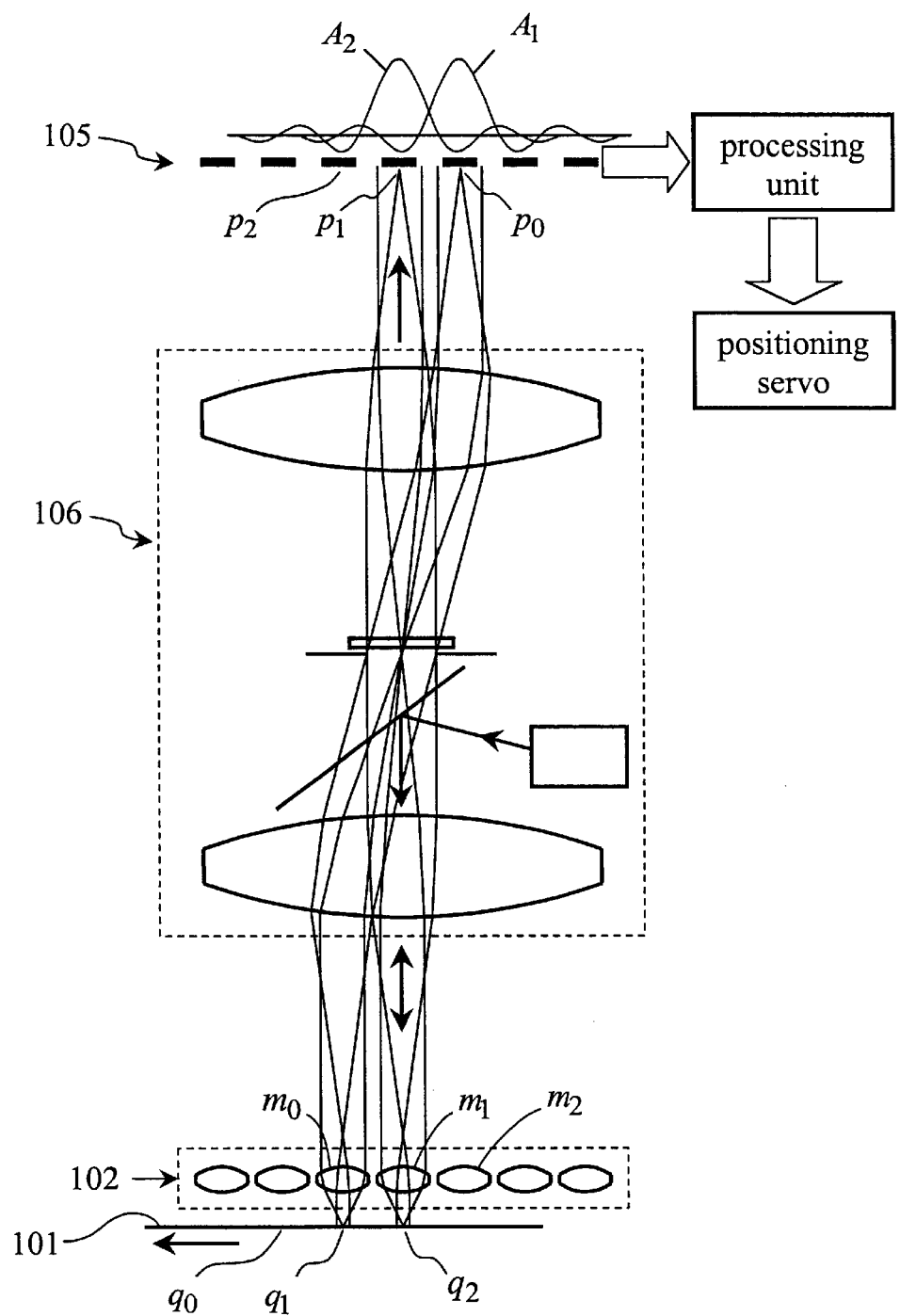
FIG. 10 illustrates the microlens imaging system of FIG. 1 with the object surface translationally moved by one microlens unit.

This first image is acquired with the object surface in the position illustrated in FIG. 1. The second image is acquired with the object surface 101 translationally shifted, as illustrated in FIG. 10, so that object points $q_1$ and $q_2$ are now illuminated through respective microlenses $m_0$ and $m_1$ (rather than $m_1$ and $m_2$), and the detector fields $A_1$ and $A_2$ originating from $q_1$ and $q_2$ are now focused onto respective pixels $p_0$ and $p_1$. In this configuration, the $\pi/2$ phase shift is applied to $A_2$ (the field that passes through $m_1$) rather than $A_1$, and the image irradiance $E^{(2)}$ is $$E^{(2)} = \eta|A_1 + iA_2|^2 = \eta(|A_1|^2 + |A_2|^2 + 2Im[A_1 A_2^*]) \qquad \text{Eq. 6}$$

(It is assumed here that the detector fields $A_1$ and $A_2$ are substantially unaffected by the translational shift, other than to switch the $\pi/2$ phase shift from $A_1$ to $A_2$.) The processing unit adds the two image distributions, and the phase coherence image component (i.e., the $Im[A_1 A_2^*]$ term) cancels out in the sum, $$E^{(1)} + E^{(2)} = 2\eta(|A_1|^2 + |A_2|^2) \qquad \text{Eq. 7}$$

The above equations apply to the case when only two illuminated object points, $q_1$ and $q_2$, are significantly reflective. More generally, the irradiance on a typical pixel—for example, pixel $p_1$—will be dominated by illumination transmitting from a particular corresponding microlens ($m_1$) and adjacent microlenses ($m_0$ and $m_2$). Over the detector region where the $A_1$ field from point $q_1$ is dominant (i.e., on pixel $p_1$ in FIG. 1, and on $p_0$ in FIG. 10), Eqs. 1–3 and 5–7 can be generalized by substituting $(A_0+A_2)$ for all occurrences of $A_2$. (As above $A_0$, $A_1$, and $A_2$ represent the detector-plane image fields from respective focal points $q_0$, $q_1$, $q_2$, etc., without the induced phase shift.) The term $|A_0+A_2|^2$ is comparatively insignificant over the region where $A_1$ is dominant, and neglecting this term Eqs. 5–7 generalize to $$E^{(1)} \cong \eta|i A_1 + (A_0 + A_2)|^2 = \eta(|A_1|^2 + |A_0 + A_2|^2 - 2Im[A_1(A_0 + A_2)^*]) \qquad \text{Eq. 8}$$

$$\cong \eta(|A_1|^2 - 2Im[A_1(A_0 + A_2)^*]) \text{ (where } A_1 \text{ is dominant)}$$

$$E^{(2)} \cong \eta|A_1 + i(A_0 + A_2)|^2 = \eta(|A_1|^2 + |A_0 + A_2|^2 + 2Im[A_1(A_0 + A_2)^*]) \qquad \text{Eq. 9}$$

$$\cong \eta(|A_1|^2 + 2Im[A_1(A_0 + A_2)^*]) \text{ (where } A_1 \text{ is dominant)}$$

$$E^{(1)} + E^{(2)} \cong 2\eta|A_1|^2 \text{ (where } A_1 \text{ is dominant)} \qquad \text{Eq. 10}$$

These equations apply to a one-dimensional microlens array. For a two-dimensional array (FIGS. 6A and 6B; FIG. 8), a typical microlens has four adjacent microlenses along the $\hat{x}$ and $\hat{y}$ directions and the subexpression $(A_0+A_2)$ would be replaced by a sum of four corresponding, overlapping fields.

As described above, the two irradiance distributions $E^{(1)}$ and $E^{(2)}$ are acquired with the object surface translationally shifted by one microlens unit between image acquisitions. However, the translational shift could generally be any odd number of microlens units—this will have the same effect of sign-inverting the phase shift. For a two-dimensional microlens array with periodicity directions $\hat{x}$ and $\hat{y}$, the positional shift could consist of an odd number of microlens steps in one of the two principal directions ($\hat{x}$ or $\hat{y}$) and an even number of steps in the other principal direction. (The odd number is preferably 1, and the even number is preferably 0.)

Rather than moving the object surface, the translational shift could alternatively be effected by moving the phase plate 302 in FIG. 3 or the microlens array 102 in FIG. 4 relative to the object surface 101 in order to sign-invert the coherent interaction term. (In this mode of operation only the phase-shifting mechanism would need to be translated. The projection system and detector array need not move.)

Phase Contrast Enhancement

The phase-shifting microlens embodiments described above function to mitigate aperture diffraction effects in the detector signal by reducing coherent interactions between overlapping image fields. Alternatively, a phase-shifted microlens array may be used to enhance the coherent phase interactions and thereby provide phase contrast imaging capability. For example, the two detector irradiance distributions $E^{(1)}$ and $E^{(2)}$ in Eqs. 8 and 9 can be subtracted, rather than added, in order to eliminate the incoherent image component and isolate the coherent component, $$E^{(2)} - E^{(1)} \cong 4\eta Im[A_1(A_0+A_2)^*] \text{ (where } A_1 \text{ is dominant)} \qquad \text{Eq. 11}$$

The difference and sum can also be divided to obtain a phase-sensitive quantity that does not depend on the illumination source intensity level or optical efficiency factors (provided that these factors remain constant between the two image acquisitions), $$\frac{E^{(2)} - E^{(1)}}{E^{(1)} + E^{(2)}} \cong \frac{2 \; Im[A_1(A_0+A_2)^*]}{|A_1|^2} \text{ (where } A_1 \text{ is dominant)} \qquad \text{Eq. 12}$$

The coherent interaction term δE (Eq. 3) is proportional to the product of the overlapping image field amplitudes $A_1$ and $A_2$ associated with the interacting object points $q_1$ and $q_2$, so in order to optimize the phase contrast signal it is beneficial if the fields both have large amplitudes over their overlapping area. In this context, the use of an apodizing filter is counter-productive because an apodizer operates to concentrate the image fields onto localized focus spots on the detector with minimal overlap. Conversely, the phase contrast sensitivity can be improved by using an aperture transmittance filter that enhances, rather than suppresses, aperture diffraction. A filter having this kind of characteristic is described below. Also, an improved wafer-tracking method based on phase contrast imaging will be described which, unlike the above method, does not require two image acquisitions with the object surface repositioned between acquisitions. (In essence, data from multiple microlenses in a single image acquisition is combined to provide effectively the same kind of information that would be obtained from multiple image acquisitions.)

Figure 11:
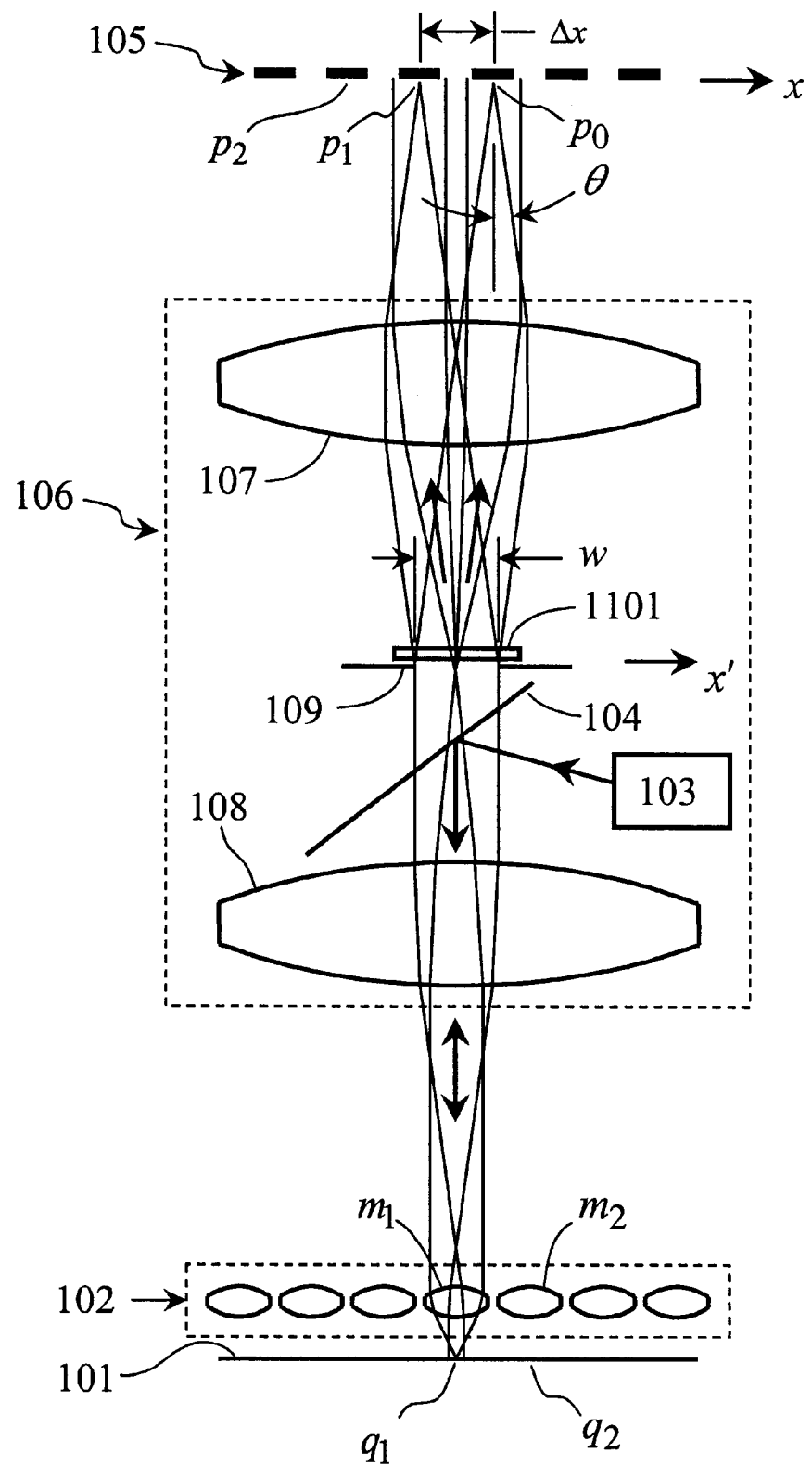
FIG. 11 illustrates a microlens imaging system that provides phase contrast enhancement by means of a phase-shifted microlens array and a beam-splitting transmission filter in the projection aperture.

FIG. 11 illustrates an embodiment of the invention that, in contrast to the FIG. 1 embodiment, functions to enhance phase contrast. The elements in FIG. 11 are identical or similar to corresponding elements in FIG. 1, except that in lieu of the apodizer 111 this embodiment comprises a beam-splitting transmission filter 1101 in or proximate to projection aperture 109. The filter functions to split the light from any particular illuminated object point into two diffracted beams that are directed onto separate pixels. For example, light from point $q_1$ is split between pixels $p_0$ and $p_1$. (In essence, the filter functions as a diffraction grating which produces two dominant diffracted orders. In alternative embodiments, the filter may comprise a diffraction grating that generates more than two dominant diffracted orders that are focused onto separate pixels.)

Denoting the aperture position coordinate in the plane of FIG. 11 as x', the filter 1101 preferably has an amplitude transmittance function t[x'] of the form illustrated in FIG. 12 and described by the following equation, $$t[x'] = \qquad \text{Eq. 13}$$

$$rect[2x'/w](1 + \cos[4\pi x'/w]) - \frac{1}{2} rect[x'/w](1 + \cos[2\pi x'/w])$$

where w is the aperture width and $$rect[x] = \begin{cases} 1 & \text{for } |x| < \frac{1}{2} \\ 0 & \text{for } |x| > \frac{1}{2} \end{cases} \qquad \text{Eq. 14}$$

As can be seen, the filter has an amplitude transmittance over the central portion that is sign-inverted relative to the peripheral portion.

Assuming that the aperture is overfilled and uniformly illuminated, the detector-plane amplitude field $A_1$ originating from $q_1$ has the form illustrated in FIG. 13 and approximately described by the following equation, $$A_1[x] = \frac{\sin[\pi \; NA \; x/\lambda]}{(\pi \; NA \; x/\lambda)(1 - (NA \; x/\lambda)^2)} - \frac{\sin[2\pi \; NA \; x/\lambda]}{(2\pi \; NA \; x/\lambda)(1 - (2 \; NA \; x/\lambda)^2)} \qquad \text{Eq. 15}$$

where x is the detector-plane position coordinate, λ is the wavelength, and NA is the illumination numerical aperture on detector array 105. The NA is defined by $$NA = \sin \theta \qquad \text{Eq. 16}$$

where θ is the illumination half-angle on the detector, as defined by the limit rays at aperture 109 (FIG. 11). The pixel center spacing Δx (FIGS. 11, 13) preferably has the following approximate value in order to optimize phase-contrast imaging performance, $$\Delta x = 1.78 \lambda / NA \qquad \text{Eq. 17}$$

The above design prescription assumes that the radiation field from each microlens overfills and uniformly illuminates aperture 109. In practice this assumption may not hold; however the filter transmittance profile may be modified so that the product of the transmittance amplitude and the incident field amplitude from an on-axis microlens (e.g., $q_1$ in FIG. 11) has the form described by Eq. 13. With this modification the filter transmittance counterbalances and compensates for the illumination nonuniformity.

The $A_1$ field has separate amplitude maxima covering pixels $p_0$ and $p_1$ (FIG. 13); and point $q_2$ (FIG. 11) gives rise to a similar amplitude field $A_2$ (dashed curve in FIG. 13) covering pixels $p_1$ and $p_2$. $A_2$ has the form $$A_2[x] = A_1[x + \Delta x] \qquad \text{Eq. 18}$$

The irradiance on pixel $p_1$ is a coherent (or in general, partially coherent) superposition of the two image fields originating from object points $q_1$ and $q_2$, so the detector signal from pixel $p_1$ will be sensitive to any phase offset between these fields. The two field amplitudes $A_1$ and $A_2$ illustrated in FIG. 13 represent the system's optical response for illuminated object points $q_1$ and $q_2$ with unit reflectance amplitude and no height offset. In general, the field amplitude on pixel $p_1$ has the form $r_1 A_1 + r_2 A_2$, wherein $r_1$ and $r_2$ are complex scaling factors that are proportional to the complex reflectances at respective points $q_1$ and $q_2$. Also, $r_1$ and r2 are phase-shifted in proportion to the surface heights at $q_1$ and $q_2$. The detector-plane irradiance distribution E from points $q_1$ and $q_2$ has the form $$E = \eta |r_1 A_1 + r_2 A_2|^2 \qquad \text{Eq. 19}$$

(This equation ignores the presence of illuminated object points other than $q_1$ and $q_2$, but other points have very little effect on the irradiance over pixel $p_1$.)

FIG. 14 illustrates the irradiance profile (Eq. 19) for the case when $r_1=1$ and $r_2$ represents a pure phase shift, $r_2=\exp[i\phi]$. The function is plotted for three phase shifts: $\phi=0$, $\pi/2$, and $\pi$. When $\phi=0$ (i.e., $r_2=1$), the field components from points $q_1$ and $q_2$ interfere constructively on $p_1$, resulting in a maximum signal level, and when $\phi=\pi$ ($r_2=-1$) they interfere destructively and the $p_1$ signal is substantially zero. The signal's sensitivity to small changes in $\phi$ is minimum when $\phi$ is close to 0 or $\pi$ and is maximum when $\phi$ is close to $\pm\pi/2$ ($r_2\cong\pm i$). With a conventional microlens array $\phi$ would be close to zero when the object surface has a substantially uniform reflectance phase distribution and is substantially flat, so the signal would have minimal sensitivity to small variations in surface height or reflectance. But the phase-shifted microlens array 102 (FIG. 11) is configured to induce a phase shift of $\phi\cong\pi/2$ between adjacent microlenses in the manner described previously (cf. FIGS. 3, 4), resulting in maximum phase sensitivity. The beam-splitting filter could potentially be used with a conventional (non-phase-shifted) microlens array to provide phase contrast imaging capability, and it could even be used in a conventional microscope without any microlens array. However, the phase sensitivity would typically be far superior with the use of a phase-shifted microlens array.

The beam-splitting filter 1101 can be fabricated as a half-tone, binary-transmittance mask in a manner similar to the apodizer construction taught in U.S. Pat. No. 5,859,424, although the filter's transmission profile differs from that of an apodizer.

The transmittance amplitude sign change between the filter's central and peripheral areas (FIG. 12) can be induced by means of a thickness difference between these two portions of the filter.

The transmission filter could alternatively be designed to split the light from each object point into more than two beams, each of which is focused onto a separate detector pixel. (A transmission filter having the form of a diffraction grating, such as a Dammann-type grating, could perform this function.) In this case each pixel would sense a coherent superposition of multiple image fields of significant amplitude originating from more than two microlens focal points.

The filter design outlined above can be used in conjunction with two-dimensional microlens arrays to provide enhanced sensitivity to phase variations in the $\hat{x}$ direction corresponding to the x coordinate (FIG. 11). In this mode of operation phase sensitivity to phase variations in the other principal direction ($\hat{y}$) can be minimized by using a two-dimensionally alternating phase distribution such as that illustrated in FIGS. 6A, 6B, or 8.

The above method can also be simply extended to provide sensitivity to phase variations in both the $\hat{x}$ and $\hat{y}$ directions. For example, a filter transmittance function of the form $$t[x',y']=t[x']t[y'] \quad \text{Eq. 20}$$

could be used, wherein x' and y' are position coordinates on the aperture plane, and t[x'] and t[y'] have the functional form described in Eq. 13. The resulting detector-plane amplitude distribution $A_{1,1}[x,y]$ corresponding to a particular object point will have the form $$A_{1,1}[x,y]=A_1[x]A_1[y] \quad \text{Eq. 21}$$

where $A_1[x]$ and $A_1[y]$ have the functional form described by Eq. 15. This distribution has four amplitude maxima centered on four corresponding detector pixels in a 2-by-2 subarray; thus each pixel will sense a coherent superposition of amplitudes from four object points. A transmission filter having the form of a two-dimensional grating could also be used to split each image field into a larger number of diffracted orders focused onto separate pixels in a matrix pattern.

Figure 15:
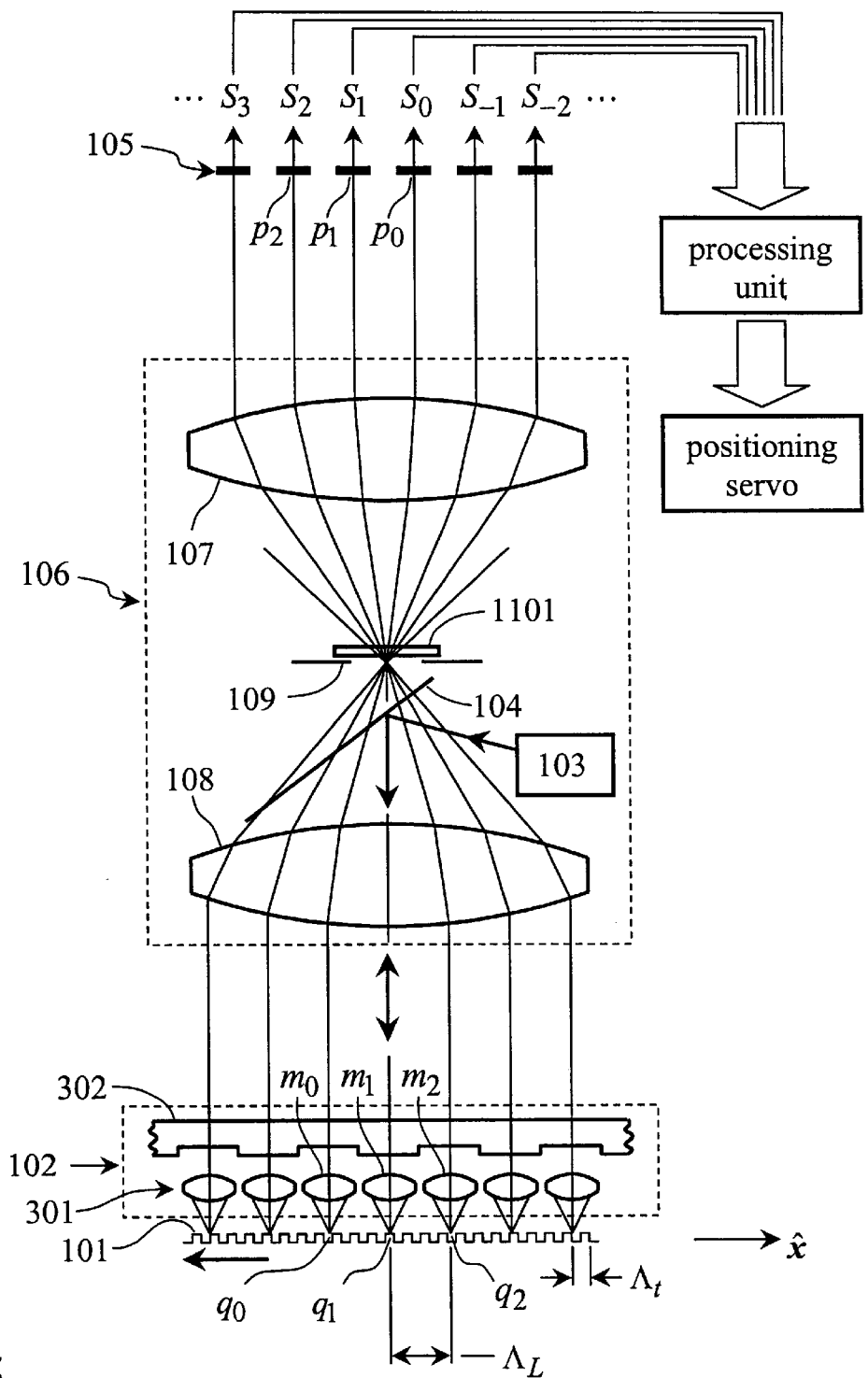
FIG. 15 illustrates an alignment tracking system comprising a phase-shifted microlens array and a beam-splitting transmission filter.

FIG. 15 illustrates an alignment tracking system employing the elements described above. The object surface 101 comprises an alignment tracking pattern which is periodic modulo-$\Lambda_t$ in the tracking direction ($\hat{x}$), and the microlens array's x-periodicity is $\Lambda_L$. The phase-shifted microlens array 102 is illustrated in FIG. 15 as the FIG. 3 embodiment, although alternative embodiments such as FIG. 4 or FIG. 5 could also be used. (The microlens array could be one-dimensional, or FIG. 15 could represent a cross-section of a two-dimensional microlens array.) The array induces a double-pass phase shift of $\pi/2$ on alternate microlenses, and a transmission filter 1101 in or proximate to projection aperture 109 divides the radiation from each illuminated object point into two beams that are directed onto two separate pixels. For example, light from point $q_1$ is divided between pixels $p_0$ and $p_1$, light from point $q_2$ is divided between pixels $p_1$ and $p_2$, etc. (Alternatively, a transmission filter such as that characterized by Eq. 20 could divide the light from each point among four pixels in a 2-by-2 subarray.) Each pixel $p_n$ ($n=\ldots, 0, 1, 2, \ldots$) generates a corresponding signal $S_n$, and the signals are collected and processed by a processing unit which calculates positional information and conveys the information to a positioning servo control system.

The tracking and lens periodicities $\Lambda_t$ and $\Lambda_L$ preferably have a relationship of the form $$\Lambda_L = \left(m + \frac{1}{2} + \frac{1}{k}\right)\Lambda_t \quad \text{Eq. 22}$$

where m and k are integers, with k even. As illustrated in FIG. 16, the resulting $S_n$-versus-n signal profile 1601 has the form of a Moiré pattern that is periodic in n with a period of k. As the surface 101 is scanned across the microlens focal plane array (FIG. 15), the signal profile's phase shifts very rapidly (as indicated by the shifted profile 1602), going through a complete $2\pi$ phase shift as the tracking pattern 101 moves by a distance of $\Lambda_t$.

Alternative Projection Optics

Figure 17:
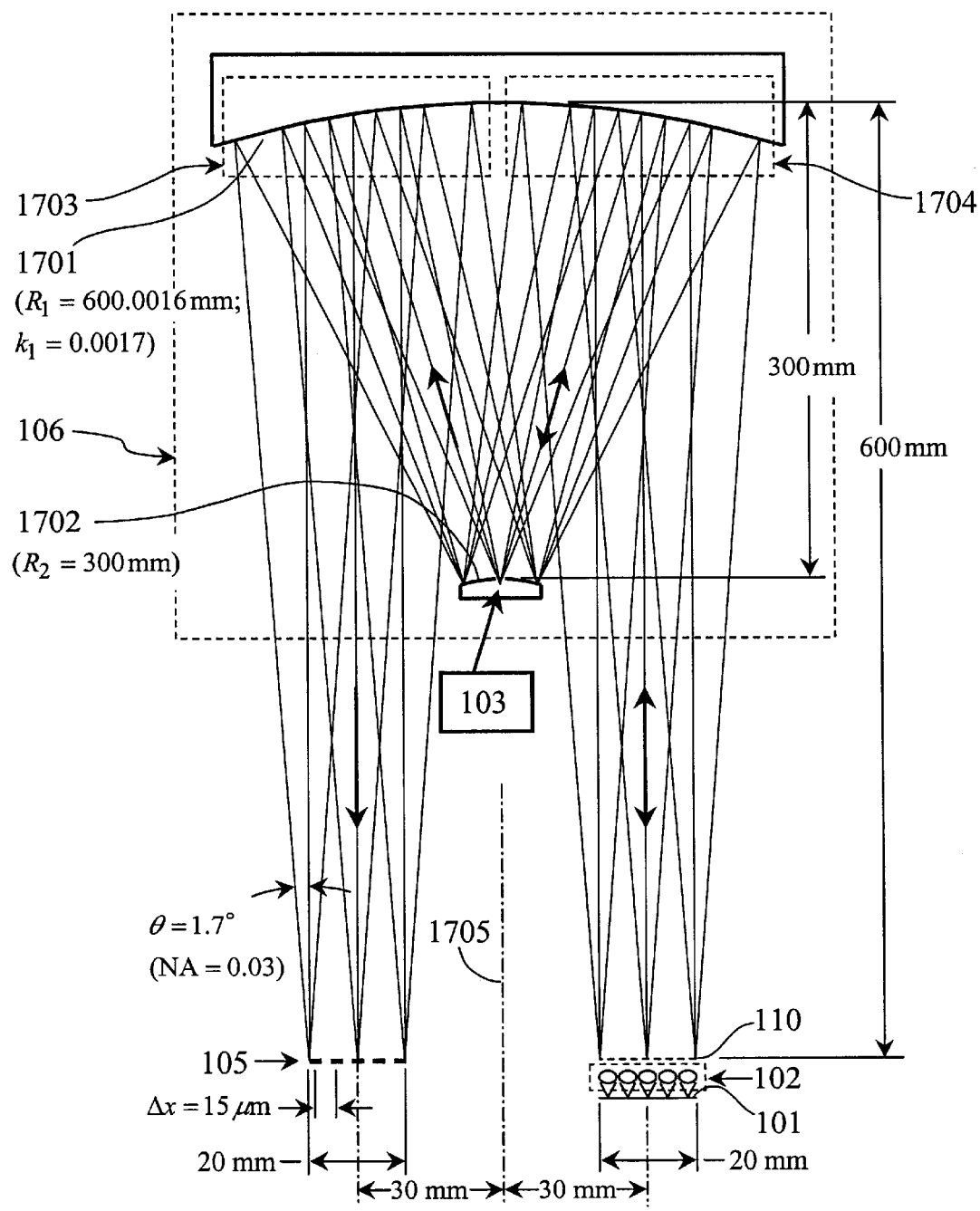
FIG. 17 illustrates an alternative projection optics embodiment comprising two mirrors.

The projection system 106 illustrated in FIGS. 1, 10, 11, and 15 is a schematic representation of an optical system that functions to image a detector conjugate plane 110 onto the detector array 105 (FIG. 1). A variety of optical systems and configurations can be used to perform this function. An example of one such alternative is illustrated in FIG. 17. This embodiment is similar to the system illustrated schematically in U.S. patent application Ser. No. 09/481,379, FIG. 5, but the present design has been optimized using the Zemax optical design program. The optimized design is similar to an "Offner Catoptric System," which is described in "Lens Design Fundamentals," by Rudolph Kingslake (Academic Press, 1978; p. 321). The dimensional proportions in FIG. 17 are exaggerated for clarity of illustration, but the dimensional numbers in the figure are representative of a practical design.

In the FIG. 17 embodiment, the projection system 106 comprises two mirrors, a large concave mirror 1701 and a small convex mirror 1702. Two off-axis portions of mirror 1701, indicated as 1703 and 1704, correspond functionally to respective projection lens elements 107 and 108 (FIGS. 1, 11). Mirror 1702 corresponds functionally to the illumination beamsplitter 104, the projection aperture 109, and (optionally) the transmission filter—either element 111 FIG. 1 or element 1101 in FIG. 11. (Mirror 1702 may have a nonuniform reflectance characteristic similar to the transmission filter's nonuniform transmittance characteristic.) Illumination from illumination source 103 enters the system through mirror 1702. A partially transmitting reflective coating may be used on mirror 1702 to pass the illumination beam. Alternatively the mirror coating could have a small pinhole opening in the center (preferably an apodized pinhole) to admit the illumination beam. After passing through mirror 1702, the illumination is collimated by the off-axis portion 1704 of mirror 1701 and is directed onto the phase-shifted microlens array 102. The radiation reflected from the microlens focal points retraces the same optical path back to mirror 1702. (The diffraction-limited beam from each microlens will fill the mirror 1702 aperture.) The radiation then reflects off of mirror 1702 and off-axis portion 1703 of mirror 1701, and is projected onto detector array 105.

The design dimensions in FIG. 17 are based on the phase-contrast-enhanced design outlined above (FIG. 11), assuming a design wavelength of $\lambda=0.25$ $\mu$m and a pixel center spacing of $\Delta x=15$ $\mu$m. Based on Eq. 17, the illumination NA at the detector is $$NA \cong 1.78 \lambda / \Delta x = 1.78(0.25 \ \mu m)/(15 \ \mu m) = 0.03 \qquad \text{Eq. 23}$$

which corresponds to an illumination half angle of $\theta=1.7°$ (Eq. 16). Mirror 1702 has a nonuniform reflectance profile that functions as the transmittance profile of filter 1101 in FIG. 11. For example, the mirror could have an amplitude reflectance profile of the form illustrated in FIG. 12 and Eq. 13. The reflectance amplitude sign change between the mirror's central and peripheral areas can be induced by means of a surface height difference between these two portions of the mirror. In more general embodiments, mirror 1702 could comprise a reflective diffraction grating which splits the reflected energy into two or more diffracted orders.

Mirrors 1701 and 1702 are configured to provide unit-magnification imaging from conjugate plane 110 onto detector array 105. The image field is 20 mm square, and is centered 30 mm off of the mirrors' optical axis 1705. The axial displacement from mirror 1701 to both the conjugate plane 110 and detector array 105 is 600 mm; and the axial displacement between mirrors 1701 and 1702 is 300 mm. Mirror 1701 is an aspheric, oblate spheroid with curvature radius $R_1=600.0016$ mm and conic constant $k_1=0.0017$; and mirror 1702 is spherical with curvature radius $R_2=300$ mm. (Each mirror is modeled as a "standard surface" in Zemax, as described in the Zemax Optical Design Program User's Guide, Version 7.0, 1998, from Focus Software, Inc.) Numerous practical variations and refinements of this design are possible (e.g., adding fold mirrors to make the system more compact, using polarization optics to control stray light, etc.), as would be evident to one skilled in optical systems design.

Conclusion

While the above is a complete description of specific embodiments of the invention, various modifications, alternative constructions, and equivalents may be used. Therefore, the above description should not be taken as limiting the scope of the invention as defined by the claims.

What is claimed is:

1. An optical subsystem for a positional alignment sensor system, the optical subsystem comprising:

a microlens array having a plurality of microlenses, each microlens positioned to focus illumination from an illumination source toward a corresponding focus spot on an object surface and to collect reflected illumination radiation from its corresponding focus spot;

a detector pixel array having a plurality of detector pixels corresponding to the plurality of microlenses, each producing a detector pixel signal representative of intensity of illumination falling thereon; and projection optics positioned to project the collected illumination radiation from the microlens array onto the detector pixel array, wherein the illumination radiation collected by each microlens is projected onto a corresponding detector-plane image field that overlaps image fields from other microlenses; and wherein the microlens array is configured to induce a relative phase shift in the image fields of adjacent microlenses, so as to modify coherent interactions between overlapping image fields.

2. The optical subsystem of claim 1, wherein the relative phase shift between adjacent microlenses' corresponding image fields, at a specific design wavelength, is $\pm \pi/2$.

3. The optical subsystem of claim 1, wherein the projection system comprises transmission optics.

4. The optical subsystem of claim 1, wherein the projection system comprises reflection optics.

5. The optical subsystem of claim 1, wherein the detector-plane image field from each microlens comprises a central energy peak that is focused onto a corresponding pixel, the image field further comprises diffraction tails that extend across adjacent pixels and overlap adjacent image fields, and the induced phase shift substantially minimizes the coherent interactions between overlapping image fields and thereby mitigates the effect of the diffraction tails on the detector-plane irradiance distribution.

6. The optical subsystem of claim 5, wherein the projection system comprises a projection aperture and an apodization filter proximate the projection aperture, the diffraction tails result from aperture diffraction at the projection aperture, and the apodization filter functions to suppress the diffraction tails.

7. The optical subsystem of claim 1, wherein:

the microlenses in the microlens array have substantially the same thickness; and the microlens array includes a phase plate proximate to the microlenses with the phase plate inducing the relative phase shift.

8. The optical subsystem of claim 1, wherein adjacent microlenses in the microlens array have differing thicknesses in order to induce the relative phase shift.

9. The optical subsystem of claim 1, wherein the microlens array comprises a periodic, one-dimensional microlens array.

10. The optical subsystem of claim 1, wherein the microlens array comprises a two-dimensional microlens array that is periodic in each of two directions denoted as $\hat{x}$ and $\hat{y}$, and the relative phase shift is induced between image fields corresponding to microlens pairs that are adjacent along either the $\hat{x}$ or $\hat{y}$ direction.

11. The optical subsystem of claim 10, wherein the projection system comprises a square, rectangular, or parallelogram-shaped projection aperture whose edges are perpendicularly aligned to the $\hat{x}$ and $\hat{y}$ directions, whereby any aperture-induced diffraction spreading of the detector-plane image fields is substantially concentrated in the $\hat{x}$ and $\hat{y}$ directions, and coherent interactions between image fields are only significant for corresponding microlenses that are adjacent along either the $\hat{x}$ or $\hat{y}$ direction.

12. The optical subsystem of claim 11, wherein the microlens array has a square or rectangular centering layout characterized by orthogonal periodicity directions $\hat{x}$ and $\hat{y}$, and the projection aperture is square or rectangular.

13. The optical subsystem of claim 11, wherein the microlens array has a non-rectangular centering layout characterized by non-orthogonal periodicity directions $\hat{x}$ and $\hat{y}$, and the projection aperture is parallelogram-shaped.

14. The optical subsystem of claim 1, wherein:
the projection system comprises a projection aperture and a beam-splitting filter proximate the projection aperture, and the beam-splitting filter diffracts the radiation so that the detector-plane image field from each microlens comprises a multiplicity of energy peaks that are focused onto separate pixels and that overlap similar energy peaks from image fields corresponding to other microlenses, whereby the coherent interactions between overlapping image fields is enhanced; and
the induced relative phase shift enhances the detector signal sensitivity to relative reflectance phase shifts at the microlens focal spots.

15. The optical subsystem of claim 14, wherein the beam-splitting filter comprises a transmission filter.

16. The optical subsystem of claim 15, wherein the beam-splitting filter comprises central and peripheral portions, the filter's amplitude transmittance over the central portion is sign-inverted relative to the peripheral portion, and the filter splits each microlens's corresponding image field into two dominant amplitude maxima that are focused onto separate pixels.

17. The optical subsystem of claim 15, wherein the beam-splitting filter comprises a transmission diffraction grating.

18. The optical subsystem of claim 14, wherein the beam-splitting filter comprises a reflection filter.

19. The optical subsystem of claim 18, wherein the beam-splitting filter comprises central and peripheral portions, the filter's amplitude reflectance over the central portion is sign-inverted relative to the peripheral portion, and the filter splits each microlens's corresponding image field into two dominant amplitude maxima that are focused onto separate pixels.

20. The optical subsystem of claim 18, wherein the beam-splitting filter comprises a reflective diffraction grating.

21. A position sensor and alignment system comprising:
the optical subsystem of claim 1;
a positioning servo that controls a relative positional alignment between the object surface and the optical subsystem; and
a processing unit that analyzes the detector pixel signals, determines positional information, and provides feedback to the positioning servo.

22. A positional sensor and alignment system comprising an illumination source, a phase-shifted microlens array, projection system, a detector pixel array, a processing unit, and a positioning servo, wherein:
each microlens focuses illumination from the illumination source toward a corresponding focus spot on an object surface;
the object surface reflects illuminating radiation at each focus spot back toward the corresponding microlens;
each microlens collects the reflected radiation from its corresponding focus spot and directs it into the projection system;
the projection system projects the collected radiation onto the detector pixel array, wherein the radiation collected by each microlens is projected onto a corresponding detector-plane image field that overlaps image fields from other micro lenses;
the phase-shifted microlens array comprises a phase-shifting mechanism that induces a phase shift between image fields from adjacent microlenses, so as to affect coherent interactions between overlapping image fields;
the overlapping image fields form a detector-plane irradiance distribution across the pixel array;
the detector pixels produce sensor signals that are responsive to the irradiance distribution; and
the sensor signals are analyzed by the processing unit to determine positional information and to provide feedback to the positioning servo, which controls the relative positional alignment between the object surface and the microlens array.

23. The sensor and alignment system of claim 22, wherein:
two sets of sensor signals are acquired with the lateral positional relationship between the phase shifting mechanism and the object surface altered between the two acquisitions;
each set of sensor signals has a signal component originating from coherent interactions between overlapping image fields; and
the altered positional relationship causes the coherent interaction signal component to be substantially sign-inverted between the two sets of sensor signals.

24. The sensor and alignment system of claim 23, wherein the processing unit adds each pixel's sensor signals from the two signal sets so that their coherent interaction components substantially cancel out in the sum and the effect of coherent interactions is thereby mitigated.

25. The sensor and alignment system of claim 23, wherein the processing unit subtracts each pixel's sensor signals from the two signal sets so that their coherent interaction components are reinforced in the difference and the effect of coherent interactions is thereby enhanced.

26. A method of operating a positional alignment sensor system that includes a microlens array having a plurality of microlenses and a detector pixel array having a plurality of detector pixels corresponding to the plurality of microlenses, each detector pixel producing a detector pixel signal representative of intensity of illumination falling thereon, the method comprising:
directing illumination radiation through the microlens array toward corresponding focus spots on an object surface;
collecting reflected illumination radiation from the focus spots;
projecting the illumination radiation collected by each microlens onto a corresponding detector-plane image field that is nominally focused onto a corresponding detector pixel with a possible overlap onto adjacent detector pixels; and
inducing a relative phase shift in the illumination fields of adjacent microlenses, so as to modify coherent interactions between possibly overlapping illumination fields.

27. The method of claim 26, wherein the relative phase shift between adjacent microlenses' corresponding image fields, at a specific design wavelength, is $\pm\pi/2$.

28. The method of claim 26, wherein:

said projecting includes diffracting the radiation so that the detector-plane image field from each microlens comprises a multiplicity of energy peaks that are focused onto separate pixels and that overlap similar energy peaks from image fields corresponding to other microlenses, whereby the coherent interactions between overlapping image fields is enhanced; and the induced phase shift enhances the detector pixel signal sensitivity to relative reflectance phase shifts at the microlens focal spots.

29. The method of claim 26, and further comprising:

analyzing the detector pixel signals to determine positional information; and providing feedback to control the relative positional alignment between the object surface and the microlens array.

30. The method of claim 29, further comprising:

acquiring two sets of detector pixel signals with the lateral positional relationship between the phase shifting mechanism and the object surface altered between the two acquisitions;

wherein each set of detector pixel signals has a signal component originating from coherent interactions between overlapping image fields, and the altered positional relationship causes the coherent interaction signal component to be substantially sign-inverted between the two sets of sensor signals.

31. The method of claim 30, and further comprising adding the detector pixel signals in one of the two signal sets to the detector pixel signals in the other of the two signal sets so that their coherent interaction components substantially cancel out in the sum and the effect of coherent interactions is thereby mitigated.

32. The method of claim 30, and further comprising subtracting the detector pixel signals in one of the two signal sets from the detector pixel signals in the other of the two signal sets so that their coherent interaction components are reinforced in the difference and the effect of coherent interactions is thereby enhanced.

* * * * *